US011839045B2

(12) United States Patent
Takeuchi

(10) Patent No.: US 11,839,045 B2
(45) Date of Patent: Dec. 5, 2023

(54) ELECTRONIC APPARATUS, AND ELECTRONIC COMPONENT UNIT

(71) Applicant: NEC Platforms, Ltd., Kawasaki (JP)

(72) Inventor: Makoto Takeuchi, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 275 days.

(21) Appl. No.: 17/289,292

(22) PCT Filed: Oct. 31, 2019

(86) PCT No.: PCT/JP2019/042812
§ 371 (c)(1),
(2) Date: Apr. 28, 2021

(87) PCT Pub. No.: WO2020/095816
PCT Pub. Date: May 14, 2020

(65) Prior Publication Data
US 2021/0392775 A1    Dec. 16, 2021

(30) Foreign Application Priority Data

Nov. 6, 2018   (JP) ................................ 2018-208874

(51) Int. Cl.
*H05K 7/14*     (2006.01)
*H05K 9/00*     (2006.01)

(52) U.S. Cl.
CPC ......... *H05K 7/1489* (2013.01); *H05K 9/0007* (2013.01)

(58) Field of Classification Search
None
See application file for complete search history.

(56) References Cited

U.S. PATENT DOCUMENTS 6,222,736 B1 *  4/2001  Sim ..................... G06F 1/188
                                                361/732
6,549,424 B1    4/2003  Beseth et al.
(Continued)

FOREIGN PATENT DOCUMENTS

JP     H06-021291 U     3/1994
JP     H07-319798 A    12/1995
(Continued)

OTHER PUBLICATIONS

International Search Report for PCT Application No. PCT/JP2019/042812, dated Dec. 24, 2019.
(Continued)

*Primary Examiner* — James Wu
*Assistant Examiner* — Christopher L Augustin

(57) ABSTRACT

An electronic apparatus including a housing, an electronic component unit main body, an engagement lever, and an engaged member, in which the engagement lever includes a lever main body, an engagement groove, and a restricting member, the lever main body is displaceable between a first state in which the one end portion is inclined to protrude rearward with respect to the other end portion in an insertion direction of the electronic component unit main body with respect to the accommodating part and the engagement groove abuts against the engaged member from the rear in the insertion direction, and a second state in which the lever main body is vertical from the one end portion to the other end portion and the engagement groove engages with the engaged member, and the restricting member is able to restrict the lever main body to being in the second state.

7 Claims, 11 Drawing Sheets

(56) References Cited

U.S. PATENT DOCUMENTS

| | | | | |
|---|---|---|---|---|
| 6,582,241 | B1* | 6/2003 | Lutz, Jr. | H01R 12/7005 439/157 |
| 10,327,547 | B1* | 6/2019 | Shih | A47B 88/48 |
| 2003/0161118 | A1* | 8/2003 | Bovell | H05K 7/1411 361/759 |
| 2003/0172523 | A1 | 9/2003 | Joist et al. | |
| 2004/0047128 | A1* | 3/2004 | McClelland, II | H05K 7/1409 361/690 |
| 2004/0192095 | A1* | 9/2004 | Joist | H05K 7/1409 439/188 |
| 2005/0088825 | A1* | 4/2005 | Miyamura | G06F 1/18 361/715 |
| 2008/0205026 | A1* | 8/2008 | Gallarelli | G11B 33/12 361/818 |
| 2011/0316403 | A1 | 12/2011 | Peng et al. | |
| 2013/0120928 | A1 | 5/2013 | Peng et al. | |
| 2015/0230360 | A1* | 8/2015 | Canfield | H05K 7/1489 403/322.4 |

FOREIGN PATENT DOCUMENTS

| | | |
|---|---|---|
| JP | H09-074293 A | 3/1997 |
| JP | 2003-141869 A | 5/2003 |
| JP | 2004-031899 A | 1/2004 |
| JP | 2012-005833 A | 1/2012 |
| JP | 2013-106041 A | 5/2013 |
| TW | M446435 U | 2/2013 |

OTHER PUBLICATIONS

Taiwanese Office Action for TW Application No. 108139606 dated Dec. 17, 2021 with English Translation.

* cited by examiner

ELECTRONIC APPARATUS, AND ELECTRONIC COMPONENT UNIT

This application is a National Stage Entry of PCT/JP2019/042812 filed on Oct. 31, 2019, which claims priority from Japanese Patent Application 2018-208874 filed on Nov. 6, 2018, the contents of all of which are incorporated herein by reference, in their entirety.

TECHNICAL FIELD

The present invention relates to an electronic apparatus and an electronic component unit.

BACKGROUND ART

In electronic apparatuses of various types such as computer devices, there are those in which an electronic component unit on which electronic components are populated is mounted in a slot provided in a housing. In such an electronic apparatus, an electronic component unit can be inserted into and removed from the slot.

Patent Document 1 discloses a configuration in which an electronic component unit (package) can be inserted into and removed from a slot. In this configuration, a guide member (rail) for guiding an insertion/removal direction of an electronic component unit (package) with respect to the slot is provided in a housing (case). Also, the slot includes a receiving connector (socket) to which a connection connector (plug) provided on the electronic component unit side is connected. In such a configuration, an electronic component unit is mounted by inserting the electronic component unit into the slot along the guide member and connecting the connection connector provided on the electronic component unit side to the receiving connector.

Further, in the configuration disclosed in Patent Document 1, an eject lever is provided. The eject lever is provided in the housing to be rotatable around a center of a mounting shaft. The eject lever includes a notch, at a distal end thereof, that engages with an engaging part (bent terminal) provided on the housing side. When the electronic component unit is removed from the slot, the connector is easily removed from the receiving connector by rotating the ejector lever around the mounting shaft.

CITATION LIST

Patent Literature

[Patent Document 1]
Japanese Unexamined Patent Application, First Publication No. H7-319798

SUMMARY OF THE INVENTION

Problems to be Solved by the Invention

Incidentally, when vibration or a force is applied from the outside to an electronic component unit mounted in a slot, electromagnetic noise may be generated. For example, when an eject lever is touched, an electronic component unit may be moved via the eject lever, a contact state between a connection connector of the electronic component unit and a receiving connector may change, and thereby electromagnetic noise may be generated. Also, when an electronic component unit is mounted in the slot, vibration may occur when the connection connector on the electronic component unit side hits the receiving connector on a housing side. In this case, the generated vibration may be transmitted to a connection portion between a connection connector of an electronic component unit and a receiving connector which are mounted in another slot, and electromagnetic noise may be generated.

An example objective of the present invention is to provide an electronic apparatus and an electronic component unit in which the above-described problem of generation of electromagnetic noise when vibration or a force is applied is solved.

Means for Solving the Problems

According to a first aspect of the present invention, an electronic apparatus includes a housing, an electronic component unit main body which is detachably provided with respect to an accommodating part provided in the housing and on which an electronic component is provided, an engagement lever which engages the electronic component unit main body with the accommodating part, and an engaged member which is provided in the accommodating part and with which the engagement lever is engageable. The engagement lever includes a lever main body extending in a vertical direction and connected to the electronic component unit main body so that one end portion in the vertical direction is swingable in a front-rear direction, an engagement groove provided at the other end portion of the lever main body in the vertical direction and configured to engage with the engaged member, and a restricting member restricting the lever main body to being on the housing. The lever main body is displaceable between a first state in which the one end portion is inclined to protrude rearward with respect to the other end portion in an insertion direction of the electronic component unit main body with respect to the accommodating part and the engagement groove abuts against the engaged member from the rear in the insertion direction, and a second state in which the lever main body is vertical from the one end portion to the other end portion and the engagement groove engages with the engaged member. The restricting member is able to restrict the lever main body to being in the second state.

According to a second aspect of the present invention, an electronic component unit includes an electronic component unit main body which is detachably provided with respect to an accommodating part provided in a housing of an electronic apparatus and on which an electronic component is provided, and an engagement lever which engages the electronic component unit main body with the accommodating part. The engagement lever includes a lever main body extending in a vertical direction and connected to the electronic component unit main body so that one end portion in the vertical direction is swingable in a front-rear direction, an engagement groove provided at the other end portion of the lever main body in the vertical direction and configured to engage with an engaged member provided in the accommodating part, and a restricting member restricting the lever main body to being on the housing. The lever main body is displaceable between a first state in which the one end portion is inclined to protrude rearward with respect to the other end portion in an insertion direction of the electronic component unit main body with respect to the accommodating part and the engagement groove abuts against the engaged member from the rear in the insertion direction, and a second state in which the lever main body is vertical from the one end portion to the other end portion and the engagement groove engages with the engaged member, and the restricting member is able to restrict the lever main body to being in the second state.

Advantageous Effects of Invention

In the electronic apparatus and the electronic component unit of the present invention, generation of electromagnetic noise when vibration or force is applied can be inhibited.

EXAMPLE EMBODIMENT

A plurality of embodiments of the present invention will be described below with reference to the drawings. However, in the present embodiment, portions the same as those in Patent Document 1 described above will be denoted by the same names, and detailed description thereof will be omitted.

In the following description, the term "electronic component unit main body" refers to a main body part of an electronic component unit and indicates a group of members including electronic components.

Also, in the following description, the term "lever main body" refers to a main body part of an engagement lever and indicates an extending member that extends in one direction.

First Embodiment

Figure 1:
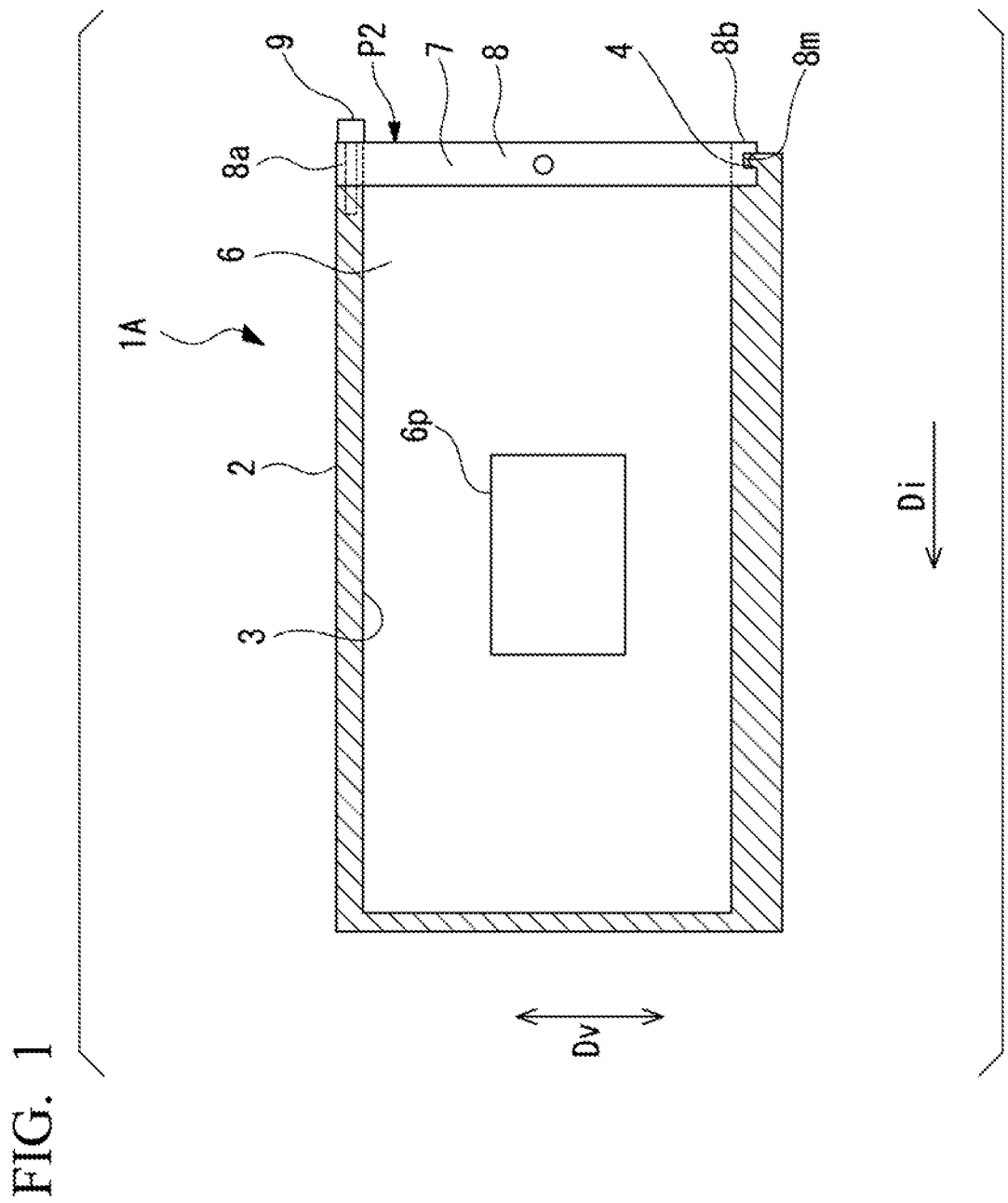
FIG. 1 is a view illustrating a minimum configuration of an electronic apparatus of the present invention.

FIG. 1 is a view illustrating a minimum configuration of an electronic apparatus according to the present embodiment.

As illustrated in this figure, an electronic apparatus 1A may include at least a housing 2, an engaged member 4, an electronic component unit main body 6, and an engagement lever 7.

The housing 2 forms an outer casing of the electronic apparatus 1A. The housing 2 includes an accommodating part 3. The accommodating part 3 accommodates the electronic component unit main body 6.

The engaged member 4 is provided in the accommodating part 3. The engaged member 4 can be engaged with the engagement lever 7.

The electronic component unit main body 6 is detachably provided with respect to the accommodating part 3. The electronic component unit main body 6 includes an electronic component 6p.

The engagement lever 7 engages the electronic component unit main body 6 with the accommodating part 3. The engagement lever 7 includes a lever main body 8 and a restricting member 9.

The lever main body 8 extends in a vertical direction Dv. The lever main body 8 is connected to the electronic component unit main body 6 so that one end portion 8a in the vertical direction Dv is swingable in a front-rear direction. The lever main body 8 includes an engagement groove 8m at the other end portion 8b in the vertical direction Dv. The engagement groove 8m engages with the engaged member 4.

Such a lever main body 8 is displaceable between a first state P1 and a second state P2 to be described below.

Figure 2:
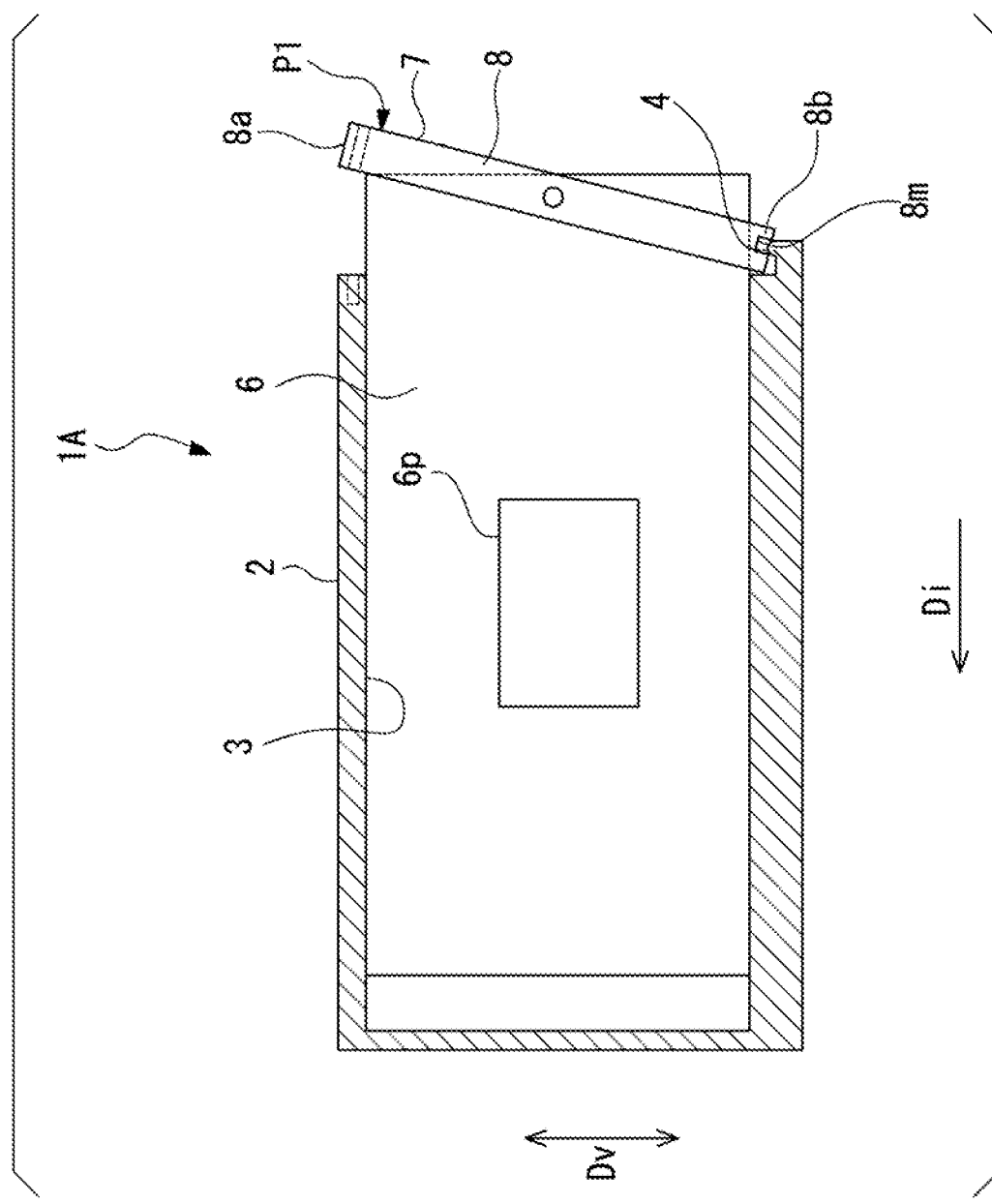
FIG. 2 is a view illustrating an engagement lever in a first state in the minimum configuration of the electronic apparatus of the present invention.

FIG. 2 is a view illustrating an engagement lever in the first state in the minimum configuration of the electronic apparatus of the present invention.

As illustrated in this figure, in the first state P1, one end portion 8a of the lever main body 8 is inclined to protrude rearward with respect to the other end portion 8b in an insertion direction Di of the electronic component unit main body 6 with respect to the accommodating part 3. Also, in the first state P1, about the lever main body 8, the engagement groove 8m of the lever main body 8 abuts against the engaged member 4 from the rear in the insertion direction Di.

As illustrated in FIG. 1, in the second state P2, the lever main body 8 is in a vertical state from one end portion 8a to the other end portion 8b. In the second state P2, the engagement groove 8m of the lever main body 8 engages with the engaged member 4.

The restricting member 9 (FIG. 1) restricts the lever main body 8 to being on the housing 2. The restricting member 9 can restrict the lever main body 8 to being in the second state P2.

When swinging of the lever main body 8 is restricted by the restricting member 9, the electronic apparatus 1A can maintain the second state P2 in which the engagement groove 8m is engaged with the engaged member 4. Thereby, the electronic component unit main body 6 can be reliably held in a state in which it is accommodated in the accommodating part 3 without the lever main body 8 being moved by an external force.

Also, the lever main body 8 is fixed by the restricting member 9 in a state in which the engagement groove 8m of the lever main body 8 engages with the engaged member 4. Thereby, the electronic component unit main body 6 is fixed by the engagement lever 7 fixed firmly to the accommodating part 3. Therefore, vibration occurring in the electronic component unit main body 6 accommodated in the accommodating part 3 due to an external force, vibration, or the like can be inhibited.

In this way, generation of electromagnetic noise due to change in a connection state of connectors or the like provided in the housing 2 caused by vibration of the electronic component unit main body 6 can be inhibited.

Further, when the electronic component unit main body 6 is mounted in the accommodating part 3, the first state P1 in which the engagement groove 8m of the lever main body 8 abuts against the engaged member 4 from the rear in the insertion direction Di is brought about. Thereafter, the lever main body 8 is rotated to be in a vertical state from one end portion 8a to the other end portion 8b so that the second state P2 is brought about. In this way, the engagement groove 8m is engaged with the engaged member 4 in stages by shifting the lever main body 8 to the second state P2 via the first state P1. Thereby, occurrence of vibration or the like when the electronic component unit main body 6 is mounted in the accommodating part 3 can be inhibited.

In this way, generation of electromagnetic noise when vibration or a force is applied to the electronic component unit main body 6 from the outside can be inhibited.

Further, in the above-described embodiment, the housing 2 is illustrated in, for example, a box shape, but any other shape and configuration may be used for the housing 2.

Also, in the above-described embodiment, the lever main body 8 is configured such that one end portion 8a positioned on an upper side is movable in the front-rear direction, and the engagement groove 8m is provided at the other end portion 8b positioned on a lower side, but the present invention is not limited thereto. An end portion positioned on a lower side of the lever main body 8 may be movable in the front-rear direction, and an engagement groove may be provided at an end portion positioned on an upper side.

Further, in the above-described embodiment, although the engaged member 4 and the engagement groove 8m are illustrated in the figures, these may have any shape and position as long as they can be engaged with each other.

Second Embodiment

Figure 3:
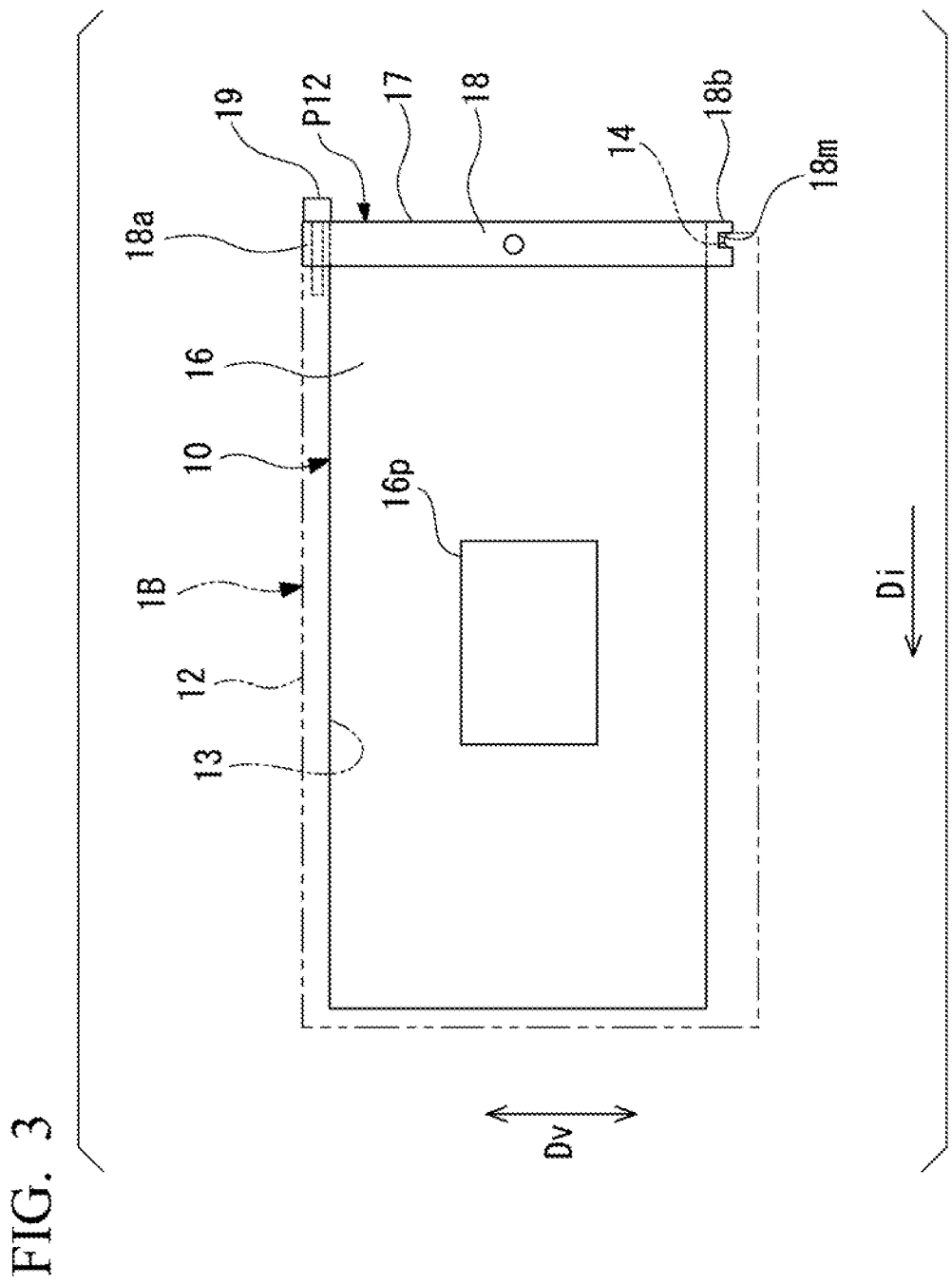
FIG. 3 is a view illustrating a minimum configuration of an electronic component unit of the present invention.

FIG. 3 is a view illustrating a minimum configuration of an electronic component unit according to the present embodiment.

As illustrated in this figure, an electronic component unit 10 may include at least an electronic component unit main body 16 and an engagement lever 17.

The electronic component unit main body 16 is detachably provided with respect to an accommodating part 13 provided in a housing 12 of an electronic apparatus 1B. The electronic component unit main body 16 includes an electronic component 16p.

The engagement lever 17 engages the electronic component unit main body 16 with the accommodating part 13. The engagement lever 17 includes a lever main body 18 and a restricting member 19.

The lever main body 18 extends in a vertical direction Dv. The lever main body 18 is connected to the electronic component unit main body 16 so that one end portion 18a in the vertical direction Dv is swingable in a front-rear direction. The lever main body 18 includes an engagement groove 18m at the other end portion 18b in the vertical direction Dv. The engagement groove 18m engages with an engaged member 14.

Such a lever main body 18 is displaceable between a first state P11 and a second state P12 to be described below.

Figure 4:
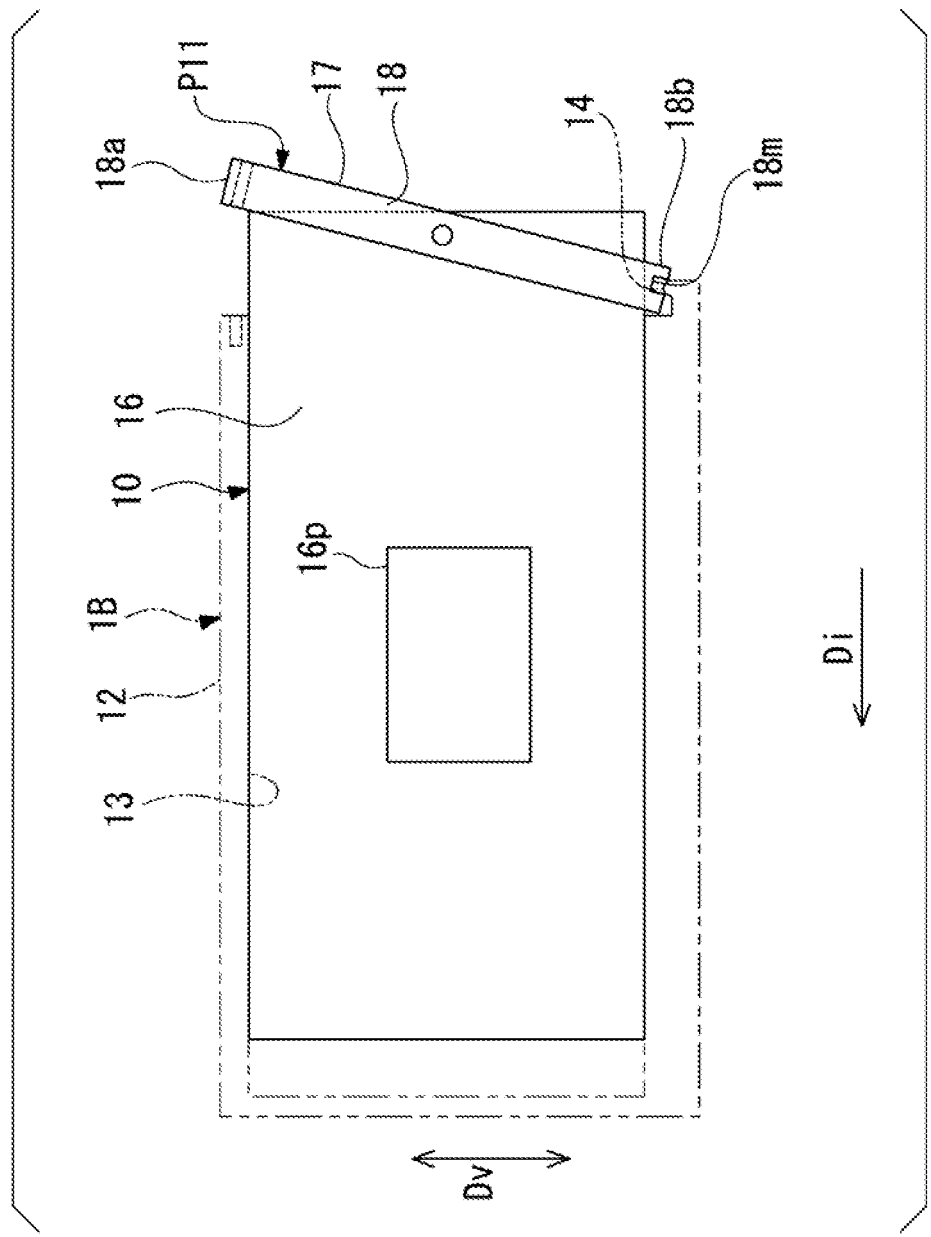
FIG. 4 is a view illustrating an engagement lever in a first state in the minimum configuration of the electronic component unit of the present invention.

FIG. 4 is a view illustrating the engagement lever in the first state in a minimum configuration of the electronic component unit of the present invention.

As illustrated in FIG. 4, in the first state P11, one end portion 18a of the lever main body 18 is inclined to protrude rearward with respect to the other end portion 18b in an insertion direction Di of the electronic component unit main body 16 with respect to the accommodating part 13. Also, in the first state P11, the engagement groove 18m of the lever main body 18 abuts against the engaged member 14 from the rear in the insertion direction Di.

As illustrated in FIG. 3, about the second state P12, the lever main body 18 is vertical from one end portion 18a to the other end portion 18b. In the second state P12, the engagement groove 18m of the lever main body 18 engages with the engaged member 14.

The restricting member 19 restricts the lever main body 18 to being on the housing 12. The restricting member 19 can restrict the lever main body 18 to being in the second state P12.

When swinging of the lever main body 18 is restricted by the restricting member 19, the electronic component unit 10 can maintain the second state P12 in which the engaged member 14 is engaged with the engagement groove 18m of the lever main body 18. Thereby, the electronic component unit main body 16 can be reliably held in a state in which it is accommodated in the accommodating part 13 without the lever main body 18 being moved by an external force.

Also, the lever main body 18 is fixed by the restricting member 19 in a state in which the engagement groove 18m of the lever main body 18 engages with the engaged member 14. Thereby, the electronic component unit main body 16 is fixed by the engagement lever 17 fixed firmly to the accommodating part 13. Therefore, vibration occurring in the electronic component unit main body 16 accommodated in the accommodating part 13 due to an external force, vibration, or the like can be inhibited. Thereby, generation of electromagnetic noise due to change in a connection state of connectors or the like provided in the housing 12 caused by vibration of the electronic component unit main body 16 can be inhibited.

Further, when the electronic component unit main body 16 is mounted in the accommodating part 13, the first state P11 in which the engagement groove 18m of the lever main body 18 abuts against the engaged member 14 from the rear in the insertion direction Di is brought about. Thereafter, the lever main body 18 is rotated to be a vertical from one end portion 18a to the other end portion 18b so that the second state P12 is brought about. In this way, when the lever main body 18 is shifted to the second state P12 via the first state P11 in stages, occurrence of vibration or the like when the electronic component unit main body 16 is mounted in the accommodating part 13 can be inhibited.

In this way, generation of electromagnetic noise when vibration or a force is applied to the electronic component unit main body 16 from the outside can be inhibited.

Further, in the above-described embodiment, the housing 12 is illustrated in, for example, a box shape, but any other shape and configuration may be used for the housing 12.

Also, in the above-described embodiment, the lever main body 18 is configured such that one end portion 18a positioned on an upper side is movable in the front-rear direction, and the engagement groove 18m is provided at the other end portion 18b positioned on a lower side, but the present invention is not limited thereto. An end portion positioned on a lower side of the lever main body 18 may be movable in the front-rear direction, and an engagement groove may be provided at an end portion positioned on an upper side.

Further, in the above-described embodiment, although the engaged member 14 and the engagement groove 18*m* are illustrated in the figure, these may have any shape, position, or the like as long as they can be engaged with each other.

Third Embodiment

Figure 5:
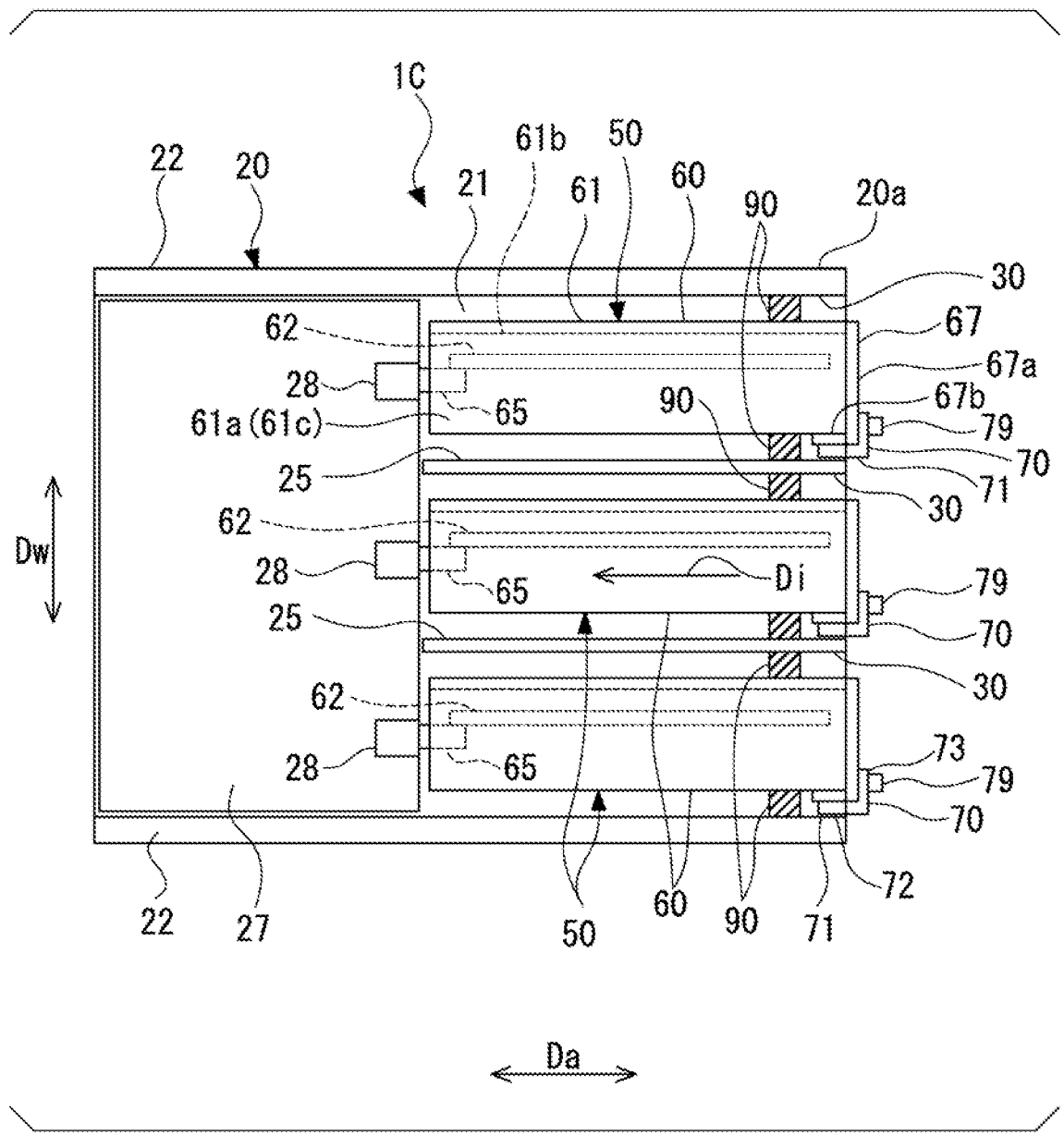
FIG. 5 is a plan view illustrating a configuration of an electronic apparatus of the present invention.
Figure 6:
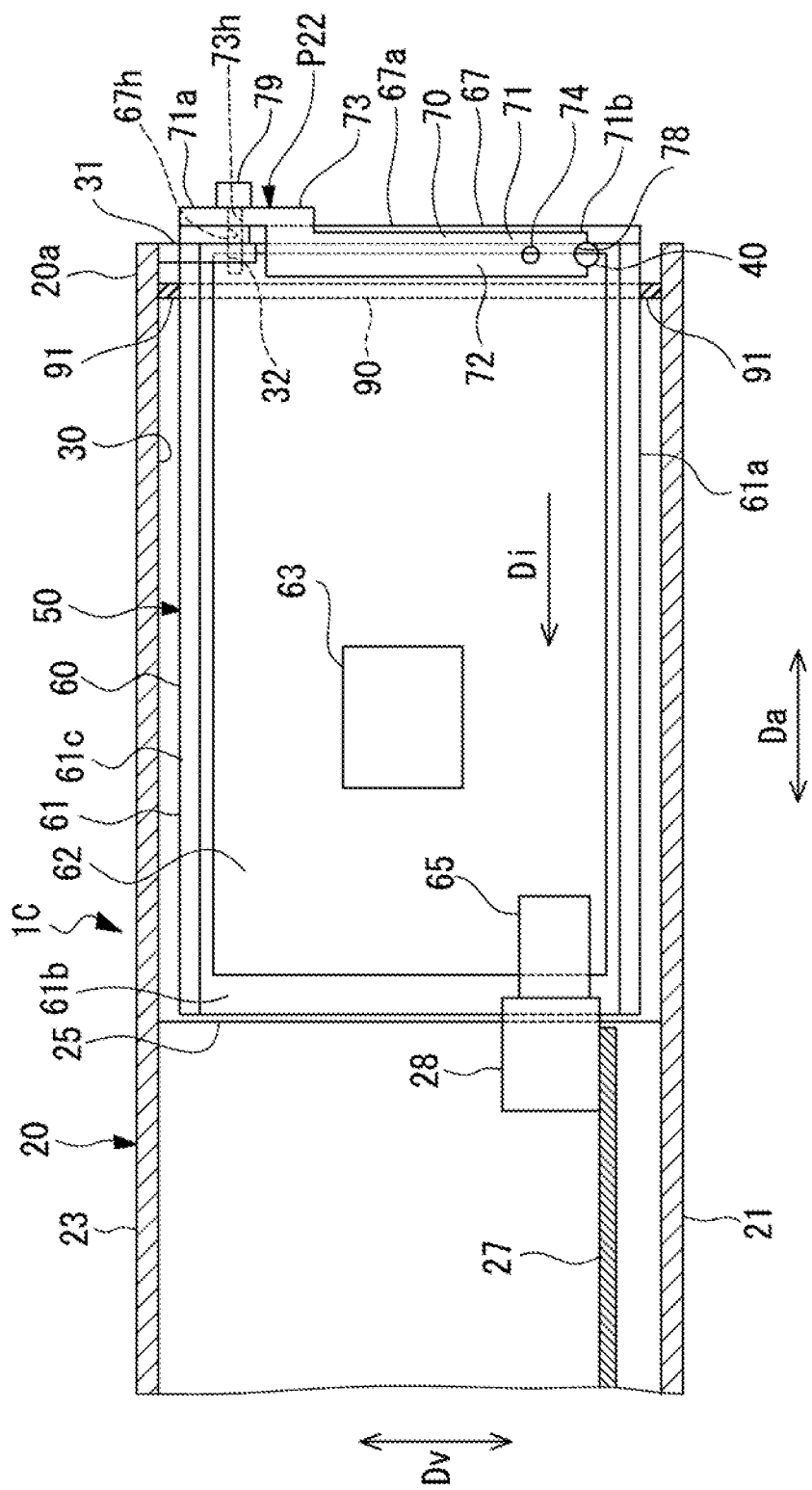
FIG. 6 is a side sectional view illustrating a configuration of the electronic apparatus of the present invention.

FIG. 5 is a plan view illustrating a configuration of an electronic apparatus of the present invention. FIG. 6 is a side sectional view illustrating a configuration of the electronic apparatus of the present invention.

As illustrated in FIGS. 5 and 6, an electronic apparatus 1C of the present embodiment includes a housing 20, an engaged member 40 (see FIG. 6), and an electronic component unit 50.

The housing 20 forms an outer casing of the electronic apparatus 1C. The housing 20 has a hollow box shape and accommodates electronic components of various types or the like therein. The housing 20 includes a bottom plate 21, a pair of side plates 22, and a top plate 23 (see FIG. 6).

In the following description, a direction in which the pair of side plates 22 face each other is referred to as a width direction Dw, a direction perpendicular to the bottom plate 21 is referred to as a vertical direction Dv, and a direction perpendicular to the width direction Dw and the vertical direction Dv is referred to as a front-rear direction Da.

The bottom plate 21 forms a lower surface of the housing 20. The bottom plate 21 has a rectangular shape in a plan view.

The pair of side plates 22 are provided on both sides of the housing 20 in the width direction Dw. The pair of side plates 22 are provided to rise upward from both end portions of the bottom plate 21 in the width direction Dw.

The top plate 23 is provided at a distance from the bottom plate 21 in the vertical direction Dv. The top plate 23 is provided on the pair of side plates 22.

Figure 7:
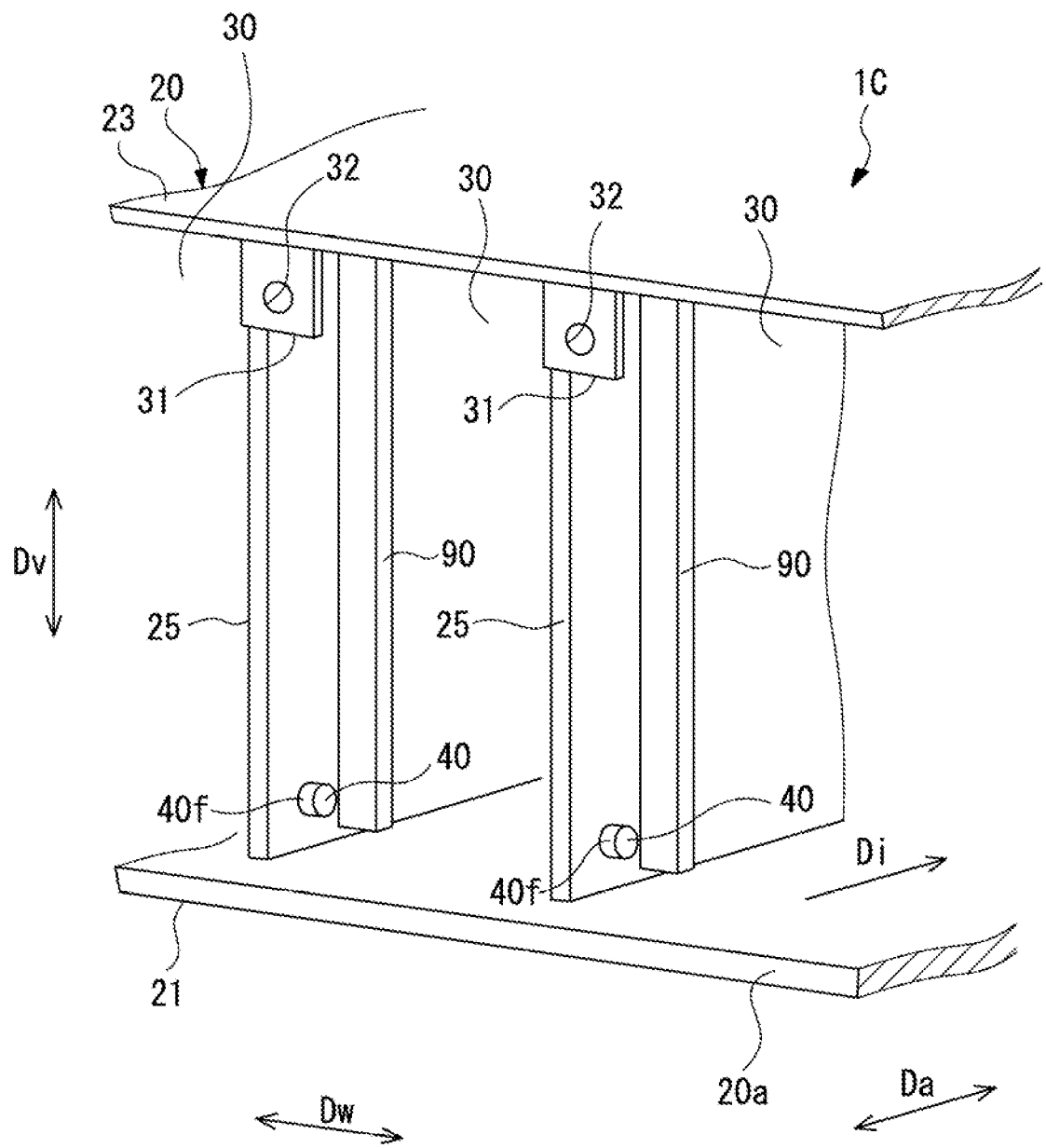
FIG. 7 is a perspective view illustrating a slot provided in a housing of the electronic apparatus of the present invention.
Figure 8:
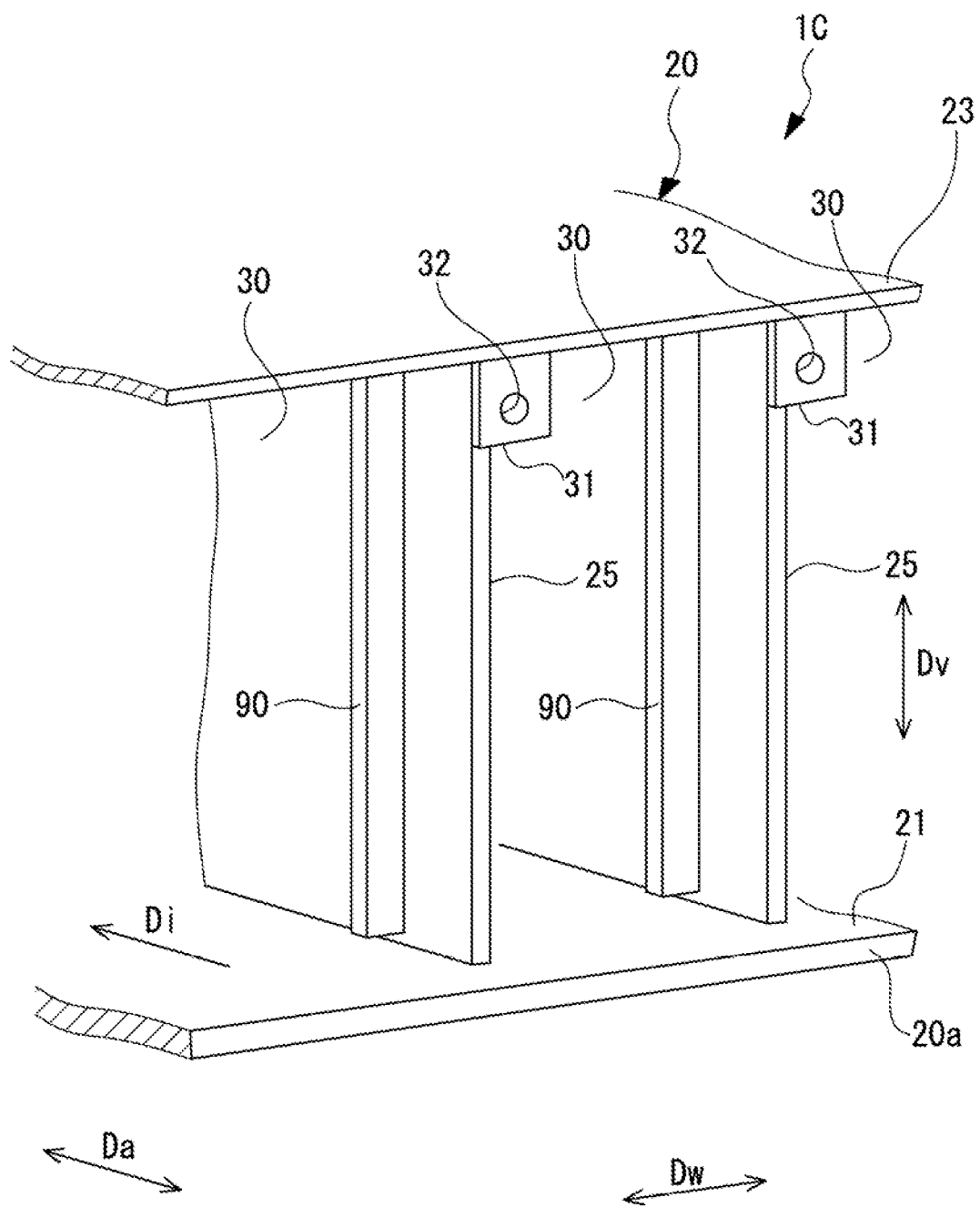
FIG. 8 is a perspective view of the slot provided in the housing of the electronic apparatus of the present invention from a direction different from that of FIG. 7.

FIG. 7 is a perspective view illustrating a slot provided in the housing of the electronic apparatus of the present invention. FIG. 8 is a perspective view of the slot provided in the housing of the electronic apparatus of the present invention from a direction different from that of FIG. 7.

As illustrated in FIGS. 5 to 8, the housing 20 includes a plurality of slots (accommodation parts) 30 at an end portion 20*a* on one side in the front-rear direction Da. A plurality of slots 30 are provided to be aligned in the width direction Dw. A plurality of partition walls 25 are provided at the end portion 20*a* of the housing 20 at intervals in the width direction Dw. The partition walls 25 have a plate shape and are each disposed in a vertical plane perpendicular to the width direction Dw. Both ends of the partition wall 25 in the vertical direction Dv are connected to the bottom plate 21 and the top plate 23. The slot 30 is formed to be surrounded by the bottom plate 21 and the top plate 23, partition walls 25 adjacent to each other in the width direction Dw, and the partition wall 25 and the side plate 22. Each slot 30 is a rectangular parallelepiped space. Each slot 30 opens toward one side in the front-rear direction Da at the end portion 20*a* of the housing 20. The slot 30 accommodates an electronic component unit main body 60 in a detachable manner.

In the present embodiment, the housing 20 may include, for example, three slots 30. However, the number of slots 30 provided in the housing 20 is not limited at all. Also, the slots 30 may be provided to be stacked in multiple stages in the vertical direction Dv in the housing 20.

In each slot 30, a seat part 31 protruding toward the inside of the slot 30 in the width direction Dw is formed on an upper portion of the partition wall 25 on one side in the width direction Dw (left side in FIGS. 7 and 8). The seat part 31 is provided in a plane perpendicular to the front-rear direction Da. A female screw hole 32 extending in the front-rear direction Da is formed in the seat part 31.

The engaged member 40 is provided in the slot 30. An engagement lever 70 can engage with the engaged member 40. The engaged member 40 is provided on the partition wall 25 on one side in the width direction Dw (for example, left side in FIG. 7) in each slot 30. The engaged member 40 is provided to protrude from the partition wall 25 toward the inside of the slot 30 in the width direction Dw. The engaged member 40 has a columnar shape having an axis in the width direction Dw and has an outer circumferential surface 40*f* curved in a circumferential shape.

As illustrated in FIGS. 5 and 6, in the housing 20, an electronic circuit board 27 is provided on the other side in the front-rear direction Da with respect to each slot 30. The electronic circuit board 27 includes a receiving connector 28 at a position corresponding to each slot 30. A connection connector 65 of the electronic component unit main body 60 to be described below is detachably connected to the receiving connector 28.

Figure 9:
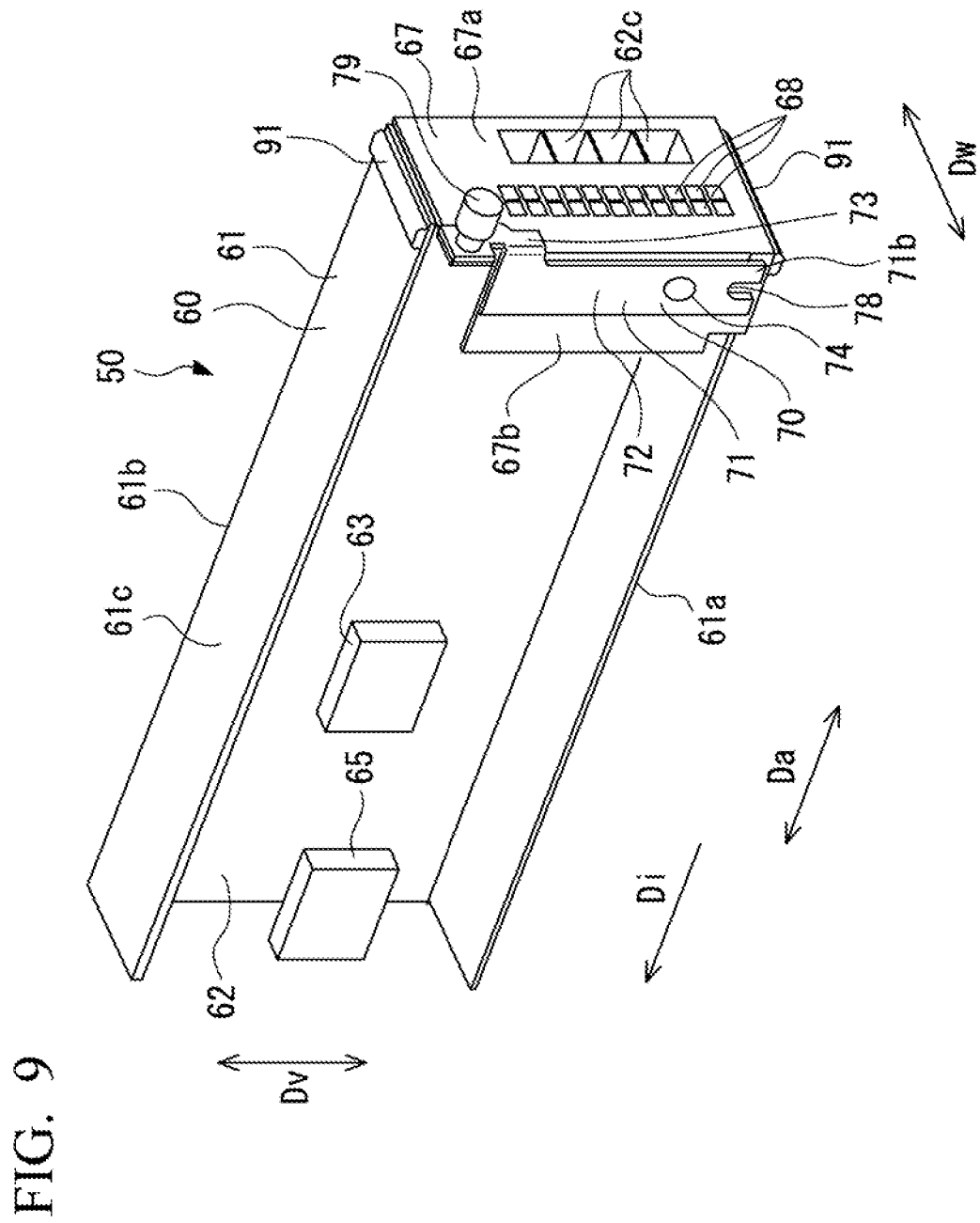
FIG. 9 is a perspective view illustrating an electronic component unit constituting the electronic apparatus of the present invention.

FIG. 9 is a perspective view illustrating an electronic component unit constituting the electronic apparatus of the present invention.

As illustrated in FIGS. 6 and 9, the electronic component unit 50 includes the electronic component unit main body 60 and the engagement lever 70.

The electronic component unit main body 60 is detachably provided with respect to the slot 30. The electronic component unit main body 60 includes a unit housing 61, a circuit board (electronic component) 62, a mounting component (electronic component) 63, the connection connector (electronic component) 65, and a unit cover 67.

The unit housing 61 includes at least a bottom plate part 61*a*. In the present embodiment, the unit housing 61 includes the bottom plate part 61*a*, a side plate part 61*b*, and a top plate part 61*c*.

The bottom plate part 61*a* has a flat plate shape and has a rectangular shape in a plan view with a long side in the front-rear direction Da. The bottom plate part 61*a* is placed on the bottom plate 21 in each slot 30. The bottom plate part 61*a* has a width dimension that is slightly smaller than an opening width of the slot 30 in the width direction Dw. The side plate part 61*b* is provided to rise upward from one end of the bottom plate part 61*a* in the width direction Dw. The top plate part 61*c* is provided in parallel above the bottom plate part 61*a*. The top plate part 61*c* is connected to an upper end of the side plate part 61*b*. Such a unit housing 61 has a substantially C shape when viewed from the front-rear direction Da.

The unit housing 61 is slidable in the front-rear direction Da on the bottom plate 21 with respect to each slot 30. The unit housing 61 the (electronic component unit main body 60) is inserted into the slot 30 in the front-rear direction Da from the end portion 20*a* on one side of the housing 20 toward an end portion 20*b* on the other side.

In the following description, a direction in which the unit housing 61 (electronic component unit main body 60) is inserted into the slot 30 is referred to as an insertion direction Di.

The circuit board 62 has a plate shape and is disposed in a plane perpendicular to the width direction Dw. The circuit board 62 has a rectangular shape in a side view from the width direction Dw. The circuit board 62 is fixed parallel to the side plate part 61*b* between the bottom plate part 61*a* and the top plate part 61*c*.

The mounting component 63 includes electric elements of various types or the like and is mounted on a surface of the circuit board 62. The mounting component 63 may be mounted on only one side of the circuit board 62 or may be mounted on both sides. Here, types, applications, shapes, the number, or the like of the mounting component 63 mounted on the circuit board 62 are not limited at all.

The connection connector 65 is provided on the circuit board 62 on the other side in the front-rear direction Da (front side in the insertion direction Di). In each slot 30, the connection connector 65 is connected to the receiving connector 28 of the electronic circuit board 27 provided on the front side in the insertion direction Di in a detachable manner in the front-rear direction Da.

In the electronic component unit main body 60, the unit cover 67 is provided at an end portion on a rear side in the insertion direction Di. The unit cover 67 is fixed to the unit housing 61 or the circuit board 62 with screws or the like (not illustrated). The unit cover 67 includes a closing surface part 67a and a side surface part 67b.

The closing surface part 67a is provided in a plane perpendicular to the front-rear direction Da. The closing surface part 67a closes an opening of the slot 30. A screw insertion hole 67h (see FIG. 6) is formed in the closing surface part 67a at a position corresponding to the above-described female screw hole 32 of the seat part 31 provided in the slot 30.

The side surface part 67b extends in the front-rear direction Da continuously from one side of the closing surface part 67a in the width direction Dw. The side surface part 67b is provided on a side opposite to the side plate part 61b of the unit housing 61 in the width direction Dw.

A plurality of ventilation openings 68 are formed in the unit cover 67. The ventilation openings 68 are each formed to penetrate the closing surface part 67a in the front-rear direction Da. Each ventilation opening 68 may have, for example, a square shape when viewed from the front-rear direction Da.

Connectors 62c of various types connected to the circuit board 62 are provided in the unit cover 67 to be exposed toward the rear in the insertion direction Di as needed. Various switches, indicator lamps, or the like connected to the circuit board 62 may be provided in the unit cover 67.

The engagement lever 70 engages the electronic component unit main body 60 with the slot 30. The engagement lever 70 includes a lever main body 71 and a restricting member 79.

The lever main body 71 integrally includes a lever base part 72 and a lever extension part 73.

The lever base part 72 has a strip plate shape extending in the vertical direction Dv in a plane perpendicular to the width direction Dw. The lever base part 72 is provided along the side surface part 67b of the unit cover 67. The lever base part 72 extends in the vertical direction Dv. A lower end portion of the lever base part 72 is rotatably connected to the side surface part 67b via a support shaft 74. The support shaft 74 is provided below an intermediate portion of the lever base part 72 in the vertical direction Dv and above a lower end of the lever main body 71 (the lever base part 72) by a predetermined dimension.

The lever extension part 73 is provided to extend from an upper end portion of the lever base part 72 to an inner side of the unit cover 67 in the width direction Dw. The lever extension part 73 abuts against the closing surface part 67a of the unit cover 67 from a rear side in the insertion direction Di.

The lever main body 71 includes an engagement groove 78 at a lower end portion 71b in the vertical direction Dv. The engagement groove 78 is formed in a semicircular arc shape to be recessed upward from a lower end of the lever base part 72. The engagement groove 78 engages with the engaged member 40.

Such a lever main body 71 rotates around the support shaft 74, and thereby an upper end portion (one end portion) 71a in the vertical direction Dv can swing in the front-rear direction Da.

The lever main body 71 is displaceable between a first state P21 and a second state P22 to be described below.

Figure 10:
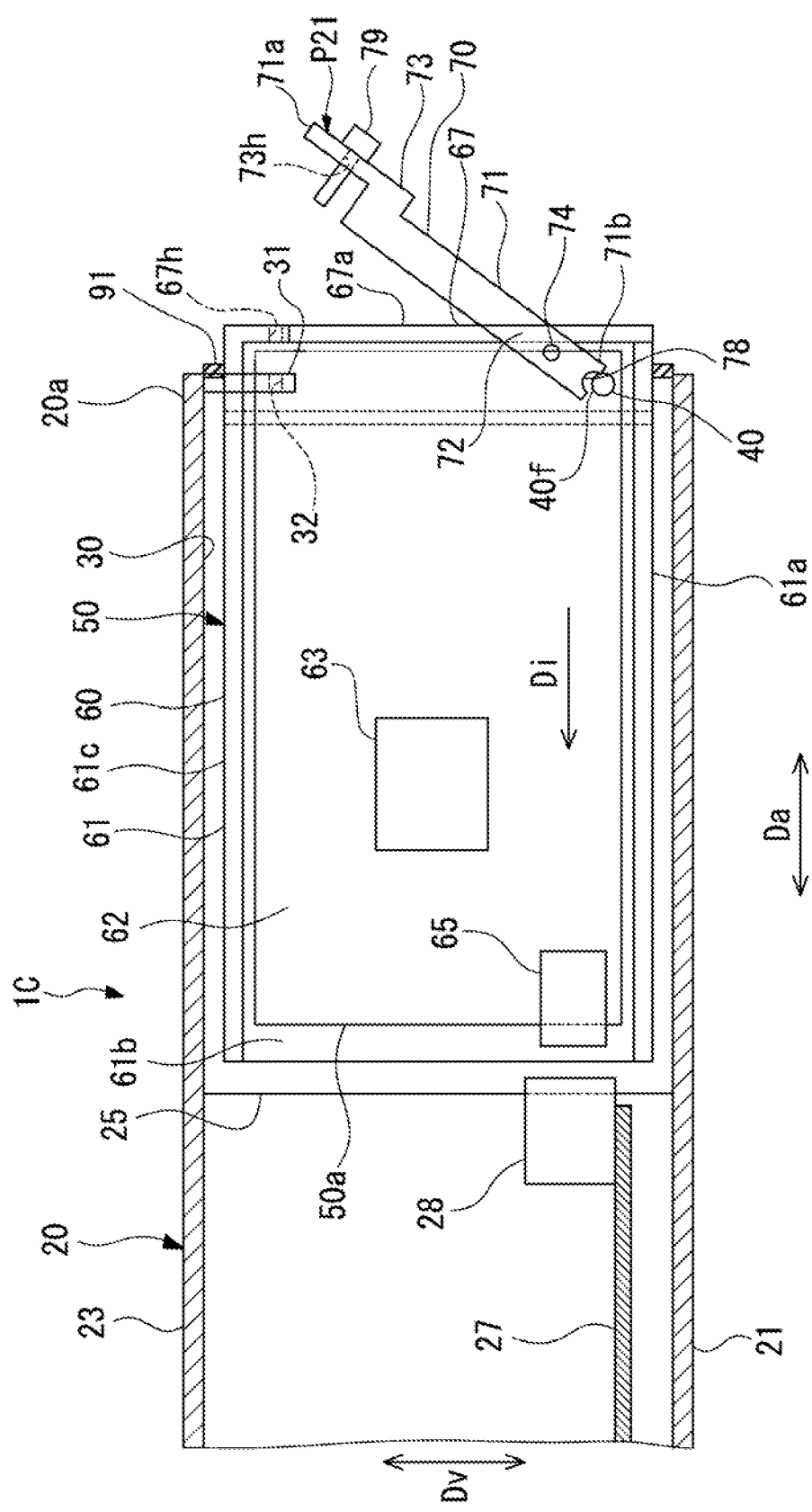
FIG. 10 is a side view illustrating a state in which the electronic component unit constituting the electronic apparatus of the present invention has been slotted in and an engagement lever is in a first state.

FIG. 10 is a side view illustrating a state in which the electronic component unit constituting the electronic apparatus of the present invention has been slotted in and the engagement lever is in a first state.

As illustrated in FIG. 10, in the first state P21, the upper end portion 71a of the lever main body 71 is inclined rearward in the insertion direction Di with respect to the lower end portion (the other end portion) 71b. In this state, the upper end portion 71a of the lever main body 71 protrudes rearward in the insertion direction Di with respect to the unit cover 67. Also, in the first state P21, the engagement groove 78 of the lever main body 71 abuts against the outer circumferential surface 40f of the engaged member 40 provided in the slot 30 from the rear in the insertion direction Di.

As illustrated in FIG. 6, in the second state P22, the lever main body 71 is vertical from the upper end portion 71a to the lower end portion 71b. In this second state P22, the engagement groove 78 of the lever main body 71 engages with the engaged member 40. Also, the lever extension part 73 of the lever main body 71 is along the closing surface part 67a of the unit cover 67.

The restricting member 79 restricts the lever main body 71 to being on the housing 20. The restricting member 79 is made of a screw member and is rotatably supported by a screw holding hole 73h formed in the lever extension part 73. The restricting member 79 is provided at a position corresponding to the screw insertion hole 67h of the unit cover 67. In the second state P22, the restricting member 79 can be fastened to the female screw hole 32 provided in the seat part 31 of the slot 30 through the screw insertion hole 67h in a state in which the lever extension part 73 is along the closing surface part 67a of the unit cover 67. Thereby, the restricting member 79 can restrict the lever main body 71 to being in the second state P22.

Also, as illustrated in FIGS. 5, 7, and 8, electromagnetic shield members 90 are provided at the partition walls 25 on both sides in the width direction Dw in each of the slots 30. The electromagnetic shield member 90 extends in the vertical direction Dv between a side surface of the electronic component unit main body 60 and the partition wall 25. Further, in the electronic component unit main body 60, on a side in which the engagement lever 70 is provided, the electromagnetic shield member 90 is disposed on a front side of the lever main body 71 of the engagement lever 70 in the insertion direction Di.

As illustrated in FIGS. 6 and 9, electromagnetic shield members 91 are each provided on an upper surface and a lower surface of the electronic component unit main body 60. The electromagnetic shield members 91 extends in the width direction Dw between the lower surface of the electronic component unit main body 60 and the bottom plate 21 and between the upper surface of the electronic component unit main body 60 and the top plate 23.

The electromagnetic shield members 90 and 91 are made of a sealing material or the like having conductivity that blocks electromagnetic waves. The electromagnetic shield members 90 and 91 inhibit leakage of electromagnetic waves (electromagnetic noise) emitted from electronic components of various types in the housing 20 to the outside of the housing 20 through a gap between the partition wall 25 and the electronic component unit 50.

Figure 11:
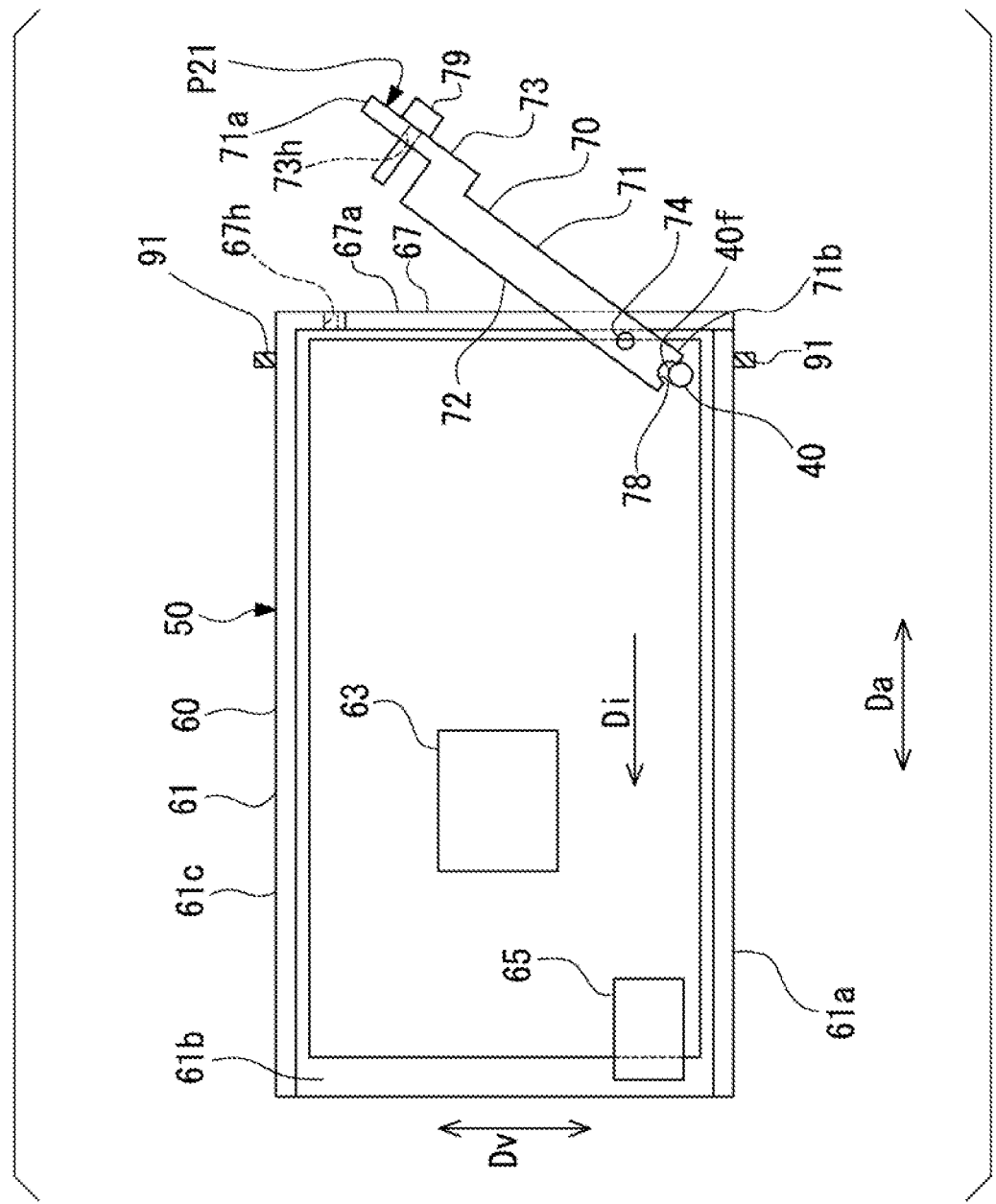
FIG. 11 is a side view illustrating a state in which the electronic component unit constituting the electronic apparatus of the present invention has been removed from the slot.

FIG. 11 is a side view illustrating a state in which the electronic component unit constituting the electronic apparatus of the present invention has been removed from the slot.

The electronic component unit 50 as described above is detachable from the slot 30. As illustrated in FIG. 11, in a state in which the electronic component unit 50 has been removed from the slot 30, the engagement lever 70 is in a state in which the upper end portion 71a of the lever main body 71 is inclined to protrude rearward in the insertion direction Di with respect to the lower end portion 71b. This is because the restricting member 79 and the lever extension part 73 are provided only on a rear side with respect to the support shaft 74 in the insertion direction Di, and the engagement lever 70 rotates in a direction in which it inclines due to the weight of the restricting member 79 and the lever extension part 73.

As illustrated in FIG. 10, in order to insert the electronic component unit 50 into the slot 30, it is inserted into the slot 30 from an end portion 50a of the electronic component unit 50 on a side opposite to a side in which the unit cover 67 and the engagement lever 70 are provided.

Then, since the upper end portion 71a of the lever main body 71 is inclined rearward in the insertion direction Di with respect to the lower end portion 71b, the engagement groove 78 opens obliquely downward toward the front side in the insertion direction Di. When the electronic component unit 50 is inserted into the slot 30 in this state, the engagement groove 78 of the lever main body 71 abuts against the engaged member 40 provided in the slot 30 from the rear in the insertion direction Di, and the operation of inserting the electronic component unit 50 into the slot 30 is temporarily stopped.

When the engagement groove 78 has abutted against the engaged member 40 in this way, the connection connector 65 provided on the circuit board 62 of the electronic component unit 50 is spaced at a distance from the receiving connector 28 in the front-rear direction Da. That is, the connection connector 65 and the receiving connector 28 are in a non-contact state.

Thereby, the engagement lever 70 is in the first state P21 in which the lever main body 71 is inclined rearward in the insertion direction Di and the engagement groove 78 abuts against the engaged member 40 from the rear in the insertion direction Di.

Thereafter, an operator presses the upper end portion 71a of the lever main body 71 toward the front side in the insertion direction Di. Then, as illustrated in FIG. 6, the lever main body 71 rotates around the support shaft 74, and the engaged member 40 provided in the slot 30 engages with the engagement groove 78. When the lever main body 71 is further pressed, the electronic component unit main body 60 is pushed into the slot 30 by the lever main body 71 that rotates around the support shaft 74 in a state in which the engagement groove 78 has engaged with the engaged member 40. Then, the connection connector 65 provided on the circuit board 62 of the electronic component unit 50 is connected to the receiving connector 28 provided in the housing 20.

Thereby, the engagement lever 70 is in the second state P22 in which the lever main body 71 is vertical and the engagement groove 78 engages with the engaged member 40.

Thereafter, the operator fastens the restricting member 79 to the female screw hole 32 provided in the seat part 31 through the screw insertion hole 67h. Thereby, the restricting member 79 restricts the lever main body 71 to being in the second state P22.

Such electronic apparatus 1C and the electronic component unit 50 can maintain the second state P22 in which the engagement groove 78 engages with the engaged member 40 by restricting swinging of the lever main body 71 using the restricting member 79. Thereby, the electronic component unit main body 60 can be reliably held in a state in which it is accommodated in the slot 30 without the lever main body 71 being moved by an external force.

Also, the lever main body 71 is fixed by the restricting member 79 in a state in which the engagement groove 78 of the lever main body 71 engages with the engaged member 40. Thereby, the electronic component unit 50 is fixed by the engagement lever 70 that is fixed firmly to the slot 30. Thereby, generation of electromagnetic noise due to change in a connection state of connectors of each part or the like provided in the housing 20 caused by vibration of the electronic component unit main body 60 can be inhibited.

Further, when the electronic component unit main body 60 is mounted in the slot 30, the first state P21 in which the engagement groove 78 of the lever main body 71 abuts against the engaged member 40 provided in the slot 30 from the rear in the insertion direction Di is brought about. Thereafter, the lever main body 71 is rotated to be brought into the second state P22 in which the lever main body 71 is in a vertical state from the upper end portion 71a to the lower end portion 71b. In this way, when the engagement groove 78 is engaged with the engaged member 40 in stages by shifting the lever main body 71 to the second state P22 via the first state P21, occurrence of vibration or the like when the electronic component unit main body 60 is mounted in the slot 30 can be inhibited.

In this way, generation of electromagnetic noise when vibration or a force is applied to the electronic component unit main body 60 from the outside can be inhibited.

Also, the lever main body 71 is provided such that the lower end portion 71b in which the engagement groove 78 is formed is disposed on a lower side and the upper end portion 71a at which the restricting member 79 is provided is positioned on an upper side.

Thereby, in a state in which the engagement groove 78 is not engaged with the engaged member 40, the lever main body 71 is in the first state P21 in which the lever main body 71 is inclined rearward in the insertion direction Di due to gravity of the restricting member 79. Thereby, when the electronic component unit main body 60 is inserted into the slot 30, it is not necessary to operate the lever main body 71 to be brought into the first state P21. Therefore, the electronic component unit 50 can be easily mounted in the slot 30.

Also, the engaged member 40 has the outer circumferential surface 40f curved in a circumferential shape on a rear side in the insertion direction Di of the electronic component unit main body 60 with respect to the slot 30.

Thereby, when the electronic component unit main body 60 is mounted in the slot 30, the insertion operation of the electronic component unit main body 60 is stopped when the engagement groove 78 abuts against the outer circumferential surface 40f of the engaged member 40. Thereby, the electronic component unit main body 60 being inadvertently pushed into the slot 30 can be suppressed.

Also, the connection connector 65 and the receiving connector 28 face each other at a distance in the insertion direction Di of the electronic component unit main body 60 with respect to the slot 30 in the first state P21, and the connection connector 65 and the receiving connector 28 are connected to each other in the second state P22.

Thereby, when the electronic component unit main body 60 is mounted in the slot 30, it is possible to prevent the connection connector 65 and the receiving connector 28 from abruptly and directly abutting against each other. Thereby, generation of vibration due to the abutting between the connection connector 65 and the receiving connector 28 can be inhibited. Therefore, generation of electromagnetic noise when the electronic component unit main body 60 is mounted in the slot 30 can be inhibited.

Also, the lever main body 71 includes the lever base part 72 provided along the side surface part 67b of the electronic component unit main body 60 facing a lateral side in the insertion direction Di with respect to the slot 30, and the lever extension part 73 extending from the lever base part 72 in a direction intersecting the insertion direction Di with respect to the slot 30 and fixed around the slot 30 in the second state P22 by the restricting member 79.

Such a lever main body 71 can be disposed by effectively utilizing a gap between the electronic component unit main body 60 and an inner circumferential surface of the slot 30.

Also, the electromagnetic shield members 90 and 91 are provided between the electronic component unit main body 60 and the inner circumferential surface of the slot 30. Thereby, it is possible to effectively inhibit leakage of electromagnetic noise to the outside through the gap between the electronic component unit main body 60 and the inner circumferential surface of the slot 30.

Further, in the above-described embodiment, the housing 20 is illustrated in, for example, a box shape, but any other shape and configuration may be used for the housing 20.

Also, in the above-described embodiment, the lever main body 71 is configured such that the upper end portion 71a positioned on an upper side is movable in the front-rear direction, and the engagement groove 78 is provided at the lower end portion 71b positioned on a lower side, but the present invention is not limited thereto. An end portion positioned on a lower side of the lever main body 71 may be movable in the front-rear direction, and an engagement groove may be provided at an end portion positioned on an upper side.

Further, in the above-described embodiment, although the engaged member 40 and the engagement groove 78 are illustrated in the figure, these may have any shape as long as they can be engaged with each other.

Also, in the above-described embodiment, the number, shapes, structures, or the like of the slots 30 provided in the housing 20 can be appropriately changed.

Further, the electronic component unit 50 may have other shapes, structures, applications, or the like.

Besides these, the configuration described in the above embodiment can be selected or appropriately changed to another configuration as long as it does not depart from the gist of the present invention.

Priority is claimed on Japanese Patent Application No. 2018-208874 filed in Japan on Nov. 6, 2018, all the disclosures of which are incorporated herein by reference.

INDUSTRIAL APPLICABILITY

In the electronic apparatus and electronic component unit of the present invention, generation of electromagnetic noise when vibration or a force is applied can be inhibited.

REFERENCE SIGNS LIST 1A, 1B, 1C Electronic apparatus
2, 12, 20 Housing
3, 13 Accommodating part
4, 14, 40 Engaged member
6, 16, 60 Electronic component unit main body
6p, 16p Electronic component
7, 17, 70 Engagement lever
8, 18, 71 Lever main body
8a, 18a One end portion
8b, 18b The other end portion
8m, 18m, 78 Engagement groove
9, 19, 79 Restricting member
10, 50 Electronic component unit
28 Receiving connector
30 Slot (accommodating part)
40f Outer circumferential surface
62 Circuit board (electronic component)
63 Mounting component (electronic component)
65 Connection connector (electronic component)
71a Upper end portion (one end portion)
71b Lower end portion (the other end portion)
72 Lever base part
73 Lever extension part
90, 91 Electromagnetic shield member
Da Front-rear direction
Di Insertion direction
Dv Vertical direction
Dw Width direction
P1, P11, P21 First state
P2, P12, P22 Second state

What is claimed is:

1. An electronic apparatus comprising:
a housing including partition walls disposed in a vertical plane perpendicular, provided at intervals in a width direction, and that form an accommodation part;
an electronic component unit main body which is detachably provided with respect to the accommodating part and on which an electronic component is provided;
an engagement lever which engages the electronic component unit main body with the accommodating part; and
an engaged member which is provided to protrude from the partition walls toward an inside of the accommodating part in the width direction and with which the engagement lever is engageable, wherein
the engagement lever comprises:
a lever main body extending in a vertical direction and connected to the electronic component unit main body so that a first end portion in the vertical direction is swingable in a front-rear direction;
an engagement groove provided at a second end portion of the lever main body in the vertical direction and configured to engage with the engaged member; and
a restricting member restricting the lever main body to being on the housing,
the lever main body is displaceable between:
a first state in which the first end portion is inclined to protrude rearward with respect to the second end portion in an insertion direction of the electronic component unit main body with respect to the accommodating part and the engagement groove abuts against the engaged member from a rear in the insertion direction; and a second state in which the lever main body is vertical from the first end portion to the second end portion and the engagement groove engages with the engaged member, and the restricting member is able to restrict the lever main body to being in the second state.

2. The electronic apparatus according to claim 1, wherein the lever main body is provided so the second end portion at which the engagement groove is formed is disposed on a lower side and the first end portion at which the restricting member is provided is positioned on an upper side.

3. The electronic apparatus according to claim 1, wherein the engaged member has an outer circumferential surface curved in a circumferential shape at least on a rear side in the insertion direction of the electronic component unit main body with respect to the accommodating part.

4. The electronic apparatus according to claim 1, wherein the electronic component unit main body includes a connection connector electrically connected to a receiving connector provided on the housing side, the connection connector and the receiving connector face each other at a distance in the insertion direction of the electronic component unit main body in the first state, and the connection connector and the receiving connector are connected to each other in the second state.

5. The electronic apparatus according to claim 1, wherein the lever main body comprises:

a lever base part provided along a side surface of the electronic component unit main body facing a lateral side in the insertion direction with respect to the accommodating part, and a lever extension part extending from the lever base part in a direction intersecting the insertion direction with respect to the accommodating part and fixed in the second state by the restricting member.

6. The electronic apparatus according to claim 1, wherein an electromagnetic shield member is provided between the electronic component unit main body and an inner circumferential surface of the accommodating part.

7. An electronic component unit comprising:

an electronic component unit main body which is detachably provided with respect to an accommodating part provided in a housing of an electronic apparatus, the housing including partition walls disposed in a vertical plane perpendicular, provided at intervals in a width direction, and that form an accommodation part, and on which an electronic component is provided; and an engagement lever which engages the electronic component unit main body with the accommodating part, wherein the engagement lever comprises:

a lever main body extending in a vertical direction and connected to the electronic component unit main body so that a first end portion in the vertical direction is swingable in a front-rear direction;

an engagement groove provided at a second end portion of the lever main body in the vertical direction and configured to engage with an engaged member provided to protrude from the partition walls toward an inside of the accommodating part in the width direction; and a restricting member restricting the lever main body to being on the housing, the lever main body is displaceable between:

a first state in which the first end portion is inclined to protrude rearward with respect to the second end portion in an insertion direction of the electronic component unit main body with respect to the accommodating part and the engagement groove abuts against the engaged member from a rear in the insertion direction; and a second state in which the lever main body is vertical from the first end portion to the second end portion and the engagement groove engages with the engaged member, and the restricting member is able to restrict the lever main body to being in the second state.

* * * * *